(12) United States Patent
Zhang

(10) Patent No.: US 9,966,379 B2
(45) Date of Patent: May 8, 2018

(54) SEMICONDUCTOR DEVICE, RELATED MANUFACTURING METHOD, AND RELATED ELECTRONIC DEVICE

(71) Applicant: Semiconductor Manufacturing International (Shanghai) Corporation, Shanghai (CN)

(72) Inventor: Gong Zhang, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days. days.

(21) Appl. No.: 14/994,516

(22) Filed: Jan. 13, 2016

(65) Prior Publication Data

US 2016/0204113 A1    Jul. 14, 2016

(30) Foreign Application Priority Data

Jan. 14, 2015 (CN) .......................... 2015 1 0019318

(51) Int. Cl.
| | |
|---|---|
| *H01L 29/812* | (2006.01) |
| *H01L 29/786* | (2006.01) |
| *H01L 27/11* | (2006.01) |
| *H01L 29/66* | (2006.01) |
| *H01L 29/08* | (2006.01) |

(52) U.S. Cl.
CPC ...... *H01L 27/1104* (2013.01); *H01L 29/0891* (2013.01); *H01L 29/66848* (2013.01); *H01L 29/78624* (2013.01); *H01L 29/812* (2013.01)

(58) Field of Classification Search
CPC ......... H01L 27/11–27/1116; H01L 2924/1437; H01L 29/66659; H01L 29/7835; H01L 29/78624; H01L 27/1104; G11C 11/41–11/419
See application file for complete search history.

(56) References Cited

U.S. PATENT DOCUMENTS

| | | | | |
|---|---|---|---|---|
| 5,631,863 A | * | 5/1997 | Fechner | G11C 11/4125 257/903 |
| 5,708,284 A | * | 1/1998 | Onishi | H01L 28/55 257/295 |
| 2008/0308864 A1 | * | 12/2008 | Lin | H01L 27/11 257/344 |
| 2012/0056276 A1 | * | 3/2012 | Cheng | H01L 21/26586 257/408 |

(Continued)

*Primary Examiner* — Daniel Luke
*Assistant Examiner* — Khatib Rahman
(74) *Attorney, Agent, or Firm* — Innovation Counsel LLP

(57) ABSTRACT

A semiconductor device may include a first inverter, a second inverter, a first access transistor, and a second access transistor. A drain electrode of the first access transistor or a source electrode of the first access transistor may be electrically connected to both an output terminal of the first inverter and an input terminal the second inverter. The drain electrode of the first access transistor may be asymmetrical to the source electrode of the first access transistor with reference to a gate electrode of the first access transistor. A drain electrode of the second access transistor or a source electrode of the second access transistor may be electrically connected to both an output terminal of the second inverter and an input terminal the first inverter.

10 Claims, 5 Drawing Sheets

(56) References Cited

U.S. PATENT DOCUMENTS

| | | | |
|---|---|---|---|
| 2012/0286263 A1* | 11/2012 | Miyake | H01L 27/1225 257/43 |
| 2013/0020571 A1* | 1/2013 | Yamazaki | H01L 29/78618 257/43 |
| 2013/0228775 A1* | 9/2013 | Noda | H01L 29/7869 257/43 |
| 2015/0318029 A1* | 11/2015 | Liu | H01L 29/4983 365/189.16 |

* cited by examiner

SEMICONDUCTOR DEVICE, RELATED MANUFACTURING METHOD, AND RELATED ELECTRONIC DEVICE

CROSS-REFERENCE TO RELATED APPLICATION

This application claims priority to and benefit of Chinese Patent Application No. 201510019318.9, filed on 14 Jan. 2015; the Chinese Patent Application is incorporated herein by reference in its entirety.

BACKGROUND OF THE INVENTION

The present invention is related to a semiconductor device, a method for manufacturing the semiconductor device, and an electronic device that includes the semiconductor device.

A semiconductor device may function as, for example, a memory device. A memory device may be used in write operations for storing data and may be used in read operations for retrieving data. A write noise margin and a read noise margin of a memory device may significantly affect performance of the memory device.

SUMMARY

An embodiment of the present invention may be related to a semiconductor device, e.g., a memory device. The semiconductor device may include a first inverter, a second inverter, a first access transistor, and a second access transistor. A drain electrode of the first access transistor or a source electrode of the first access transistor may be electrically connected to both an output terminal of the first inverter and an input terminal the second inverter (regardless of whether any transistor of the semiconductor device is turned on). The drain electrode of the first access transistor may be asymmetrical to the source electrode of the first access transistor with reference to a gate electrode of the first access transistor. A drain electrode of the second access transistor or a source electrode of the second access transistor may be electrically connected to both an output terminal of the second inverter and an input terminal the first inverter (regardless of whether any transistor of the semiconductor device is turned on).

The semiconductor device may include a first word line, a first bit line, a second word line, and a second bit line. The first word line may be electrically connected to the gate electrode of the first access transistor (regardless of whether any transistor of the semiconductor device is turned on). The first bit line may be electrically connected to the source electrode of the first access transistor (regardless of whether any transistor of the semiconductor device is turned on). The second word line may be electrically connected to a gate electrode of the second access transistor (regardless of whether any transistor of the semiconductor device is turned on). The second bit line may be electrically connected to the source electrode of the second access transistor (regardless of whether any transistor of the semiconductor device is turned on).

The drain electrode of the first access transistor may be aligned with the source electrode of the first access transistor in a first direction. At most one of the drain electrode of the first access transistor and the source electrode of the first access transistor may overlap the gate electrode of the first access transistor in a second direction, the second direction being perpendicular to the first direction. Exactly one of the drain electrode of the first access transistor and the source electrode of the first access transistor may overlap the gate electrode of the first access transistor in the second direction.

At most one of the drain electrode of the first access transistor and the source electrode of the first access transistor may directly contact the gate electrode of the first access transistor. Exactly one of the drain electrode of the first access transistor and the source electrode of the first access transistor may directly contact the gate electrode of the first access transistor.

An area of the drain electrode of the first access transistor may be unequal to an area of the source electrode of the first access transistor.

A width of the drain electrode of the first access transistor may be unequal to a width of the source electrode of the first access transistor.

The drain electrode of the second access transistor may be asymmetrical to the source electrode of the second access transistor with reference to a gate electrode of the second access transistor.

An embodiment of the present invention may be related to a method for manufacturing a semiconductor device. The method may include the following steps: providing a first semiconductor structure; partially removing the first semiconductor structure to form a second semiconductor structure, wherein the second semiconductor structure may have a first trench; performing a first in-situ doping process on the second semiconductor structure to form a third semiconductor structure, wherein the third semiconductor structure may include a first electrode, and wherein the first electrode may be positioned in the first trench; after the first electrode has been formed, partially removing the third semiconductor structure to form a fourth semiconductor structure, wherein the fourth semiconductor structure may have a second trench; performing a second in-situ doping process on the fourth semiconductor structure to form a fifth semiconductor structure, wherein the fifth semiconductor structure may include a second electrode, and wherein the second electrode may be positioned in the second trench; and after the second electrode has been formed, forming a first gate member on the fifth semiconductor structure to form a sixth semiconductor structure, wherein each of the first gate member, the first electrode, and the second electrode may directly contact a first semiconductor portion (of the sixth semiconductor structure), wherein the first semiconductor portion may be positioned between the first electrode and the second electrode, and wherein the first electrode may be asymmetrical to the second electrode with reference to the first gate member.

The method may include the following steps: forming a first inverter; and forming a second inverter. The first electrode or the second electrode may be electrically connected to both an output terminal of the first inverter and an input terminal the second inverter (regardless of whether any transistor of the semiconductor device is turned on).

The method may include the following steps: forming a third electrode; after the third electrode has been formed, forming a fourth electrode; and after the fourth electrode has been formed, forming a second gate member. The third electrode or the fourth electrode may be electrically connected to both an output terminal of the second inverter and an input terminal the first inverter (regardless of whether any transistor of the semiconductor device is turned on). Each of the second gate member, the third electrode, and the fourth electrode may directly contact a second semiconductor portion (of the sixth semiconductor structure). The second semiconductor portion may be positioned between the third electrode and the fourth electrode. The third electrode may be asymmetrical to the fourth electrode with reference to the second gate member.

The method may include forming a bit line. The bit line may be electrically connected to the second electrode or the first electrode regardless of whether the first gate member receives a turn-on signal.

The first electrode may be aligned with the second electrode in a first direction. At most one of the first electrode and the second electrode may overlap the first gate member in a second direction, the second direction being perpendicular to the first direction. Exactly one of the first electrode and the second electrode may overlap the first gate member in the second direction.

At most one of the first electrode and the second electrode may directly contact the first gate member. Exactly one of the first electrode and the second electrode directly contacts the first gate member.

An area of the first electrode may be unequal to an area of the second electrode.

A width of the first electrode may be unequal to a width of the second electrode.

An embodiment of the present invention may be related to an electronic device. The electronic device may include an electronic component and a semiconductor device electrically connected to the electronic component. The semiconductor device may have one or more aforementioned features.

According to embodiments of the present invention, one or more access transistors of a semiconductor device (e.g., a memory device) may have an asymmetrical source-drain structure. The asymmetrical source-drain structure may enable the semiconductor device to have desirable electric characteristics (e.g., electric current characteristics), such that the semiconductor device may have a desirable write noise margin and a desirable read noise margin. Advantageously, satisfactory performance of the semiconductor device (and satisfactory performance of an electronic device that includes the semiconductor device) may be substantially attained.

The above summary is related to some of many embodiments of the invention disclosed herein and is not intended to limit the scope of the invention.

BRIEF DESCRIPTION OF THE DRAWINGS

FIG. 10 shows a schematic diagram (e.g., a schematic cross-sectional view) that illustrates elements and/or structures in (an access transistor of) a semiconductor device in accordance with one or more embodiments of the present invention.

DETAILED DESCRIPTION

Figure 1:
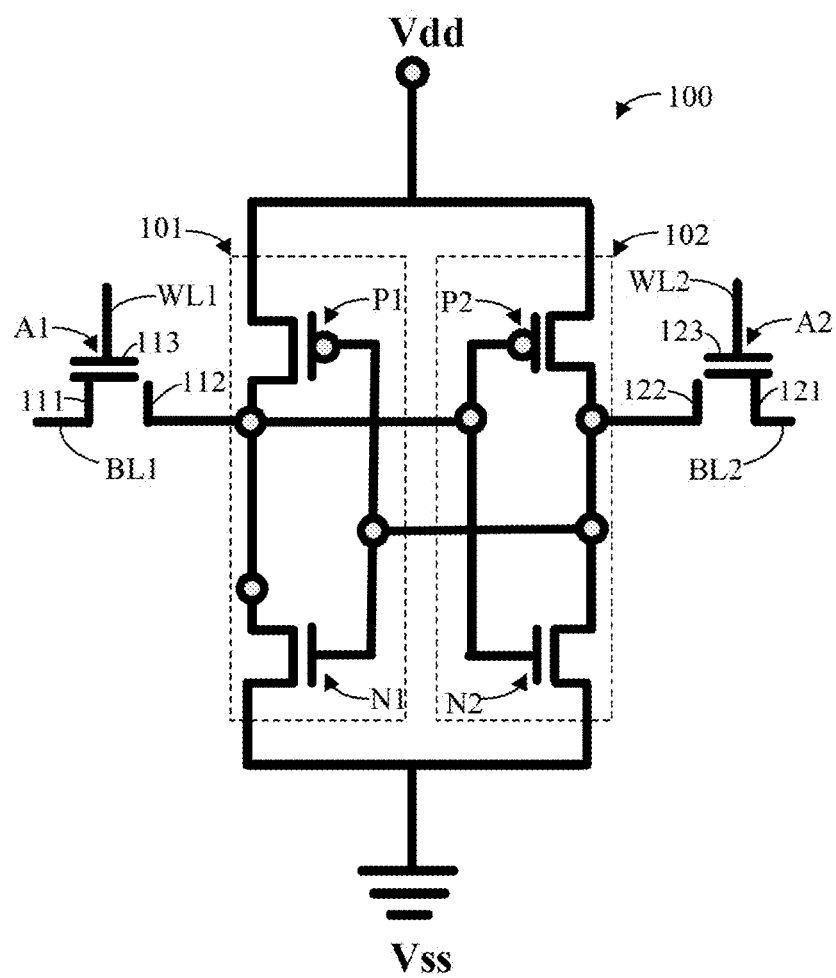
FIG. 1 shows a schematic diagram (e.g., a schematic circuit diagram) that illustrates elements and/or structures in a semiconductor device in accordance with one or more embodiments of the present invention.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive"

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

Figure 2:
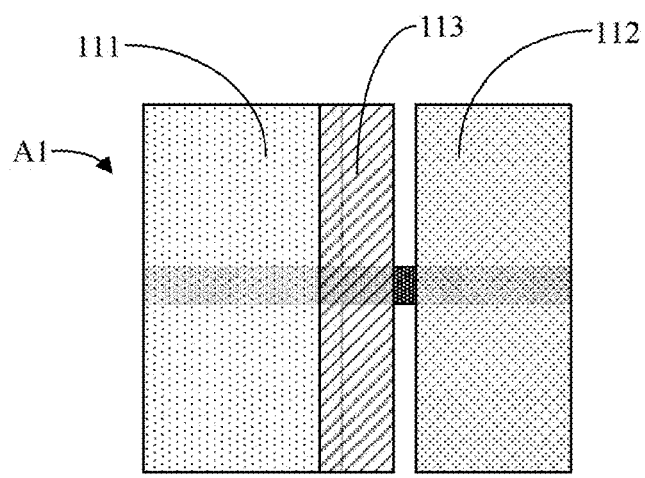
FIG. 2 shows a schematic diagram (e.g., a schematic layout view or a schematic top view) that illustrates elements and/or structures in an access transistor of a semiconductor device in accordance with one or more embodiments of the present invention.

FIG. 1 shows a schematic diagram (e.g., a schematic circuit diagram) that illustrates elements and/or structures in a semiconductor device 100 in accordance with one or more embodiments of the present invention. FIG. 2 shows a schematic diagram (e.g., a schematic layout view or a schematic top view) that illustrates elements and/or structures in an access transistor A1 of the semiconductor device 100 in accordance with one or more embodiments of the present invention. The semiconductor device 100 may be, for example, a memory device, such as a static random-access memory (SRAM) device. The semiconductor device 100 may include an inverter 101, an inverter 102, the access transistor A1, and an access transistor A2.

The inverter 101 may include a p-type transistor P1 and an n-type transistor N1. The inverter 102 may include a p-type transistor P2 and an n-type transistor N2. Each of the p-type transistors P1 and P2 may be a p-type metal-oxide-semiconductor field-effect transistor (PMOS transistor) and may be a pull-up transistor with a source electrode configured to receive a positive supply voltage Vdd. Each of the n-type transistors N1 and N2 may be an n-type metal-oxide-semiconductor field-effect transistor (NMOS transistor) and may be a pull-down transistor with a source electrode configured to receive a reference voltage (or ground voltage) Vss.

A drain electrode of the p-type transistor P1 and a drain electrode of the n-type transistor N1 may be electrically connected to each other and electrically connected to an output terminal of the inverter 101 (regardless of whether any transistor of the semiconductor device 100 is turned on). A gate electrode of the p-type transistor P1 and a gate electrode of the n-type transistor N1 may be electrically connected to each other and electrically connected to an input terminal of the inverter 101 (regardless of whether any transistor of the semiconductor device 100 is turned on).

A drain electrode of the p-type transistor P2 and a drain electrode of the n-type transistor N2 may be electrically connected to each other and electrically connected to an output terminal of the inverter 102 (regardless of whether any transistor of the semiconductor device 100 is turned on). A gate electrode of the p-type transistor P2 and a gate electrode of the n-type transistor N2 may be electrically connected to each other and electrically connected to an input terminal of the inverter 102 (regardless of whether any transistor of the semiconductor device 100 is turned on).

The access transistor A1 may include an electrode 111, an electrode 112, and a gate electrode 113 (or gate member 113). The electrode 112 and the electrode 111 may respectively be a drain electrode and a source electrode of the access transistor A1. Alternatively, the electrode 112 and the electrode 111 may respectively be a source electrode and a drain electrode of the access transistor A1. The electrode 112 may be electrically connected to both an output terminal of the inverter 101 and an input terminal the inverter 102 (regardless of whether any transistor of the semiconductor device 100 is turned on).

The access transistor A2 may include an electrode 121, an electrode 122, and a gate electrode 123 (or gate member 123). The electrode 122 and the electrode 121 may respectively be a drain electrode and a source electrode of the access transistor A2. Alternatively, the electrode 122 and the electrode 121 may respectively be a source electrode and a drain electrode of the access transistor A2. The electrode 122 may be electrically connected to both an output terminal of the inverter 102 and an input terminal the inverter 101 (regardless of whether any transistor of the semiconductor device 100 is turned on).

The semiconductor device 100 may include a word line WL1, a bit line BL1, a word line WL2, and a bit line BL2. The word line WL1 may be electrically connected to the gate electrode 113 (regardless of whether any transistor of the semiconductor device 100 is turned on). The bit line BL1 may be electrically connected to the electrode 111 (regardless of whether any transistor of the semiconductor device 100 is turned on). The word line WL2 may be electrically connected to the gate electrode 123 (regardless of whether any transistor of the semiconductor device 100 is turned on). The bit line BL2 may be electrically connected to the electrode 121 (regardless of whether any transistor of the semiconductor device 100 is turned on).

Referring to FIG. 2, the electrode 112 may be asymmetrical to the electrode 111 with reference to the gate electrode 113 (or gate member 113). An area of the electrode 112 may be unequal to an area of the electrode 111. For example, an area of the electrode 112 may be smaller than an area of the electrode 111 in a layout view of the access transistor A1. A width of the electrode 112 may be unequal to a width of the electrode 111. For example, a width of the electrode 112 in a direction may be less than a width of the electrode 111 in the direction.

The electrode 112 may be aligned with the electrode 111 in a first direction. At most one of the electrode 112 and the electrode 111 may overlap the gate electrode 113 in a second direction, the second direction being perpendicular to the first direction. In an embodiment, exactly one of the electrode 112 and the electrode 111 may overlap the gate electrode 113 in the second direction. For example, the electrode 111 may overlap the gate electrode 113 in the second direction, and the electrode 112 may not overlap the gate electrode 113 in the second direction.

At most one of the electrode 112 and the electrode 111 may directly contact the gate electrode 113. In an embodiment, exactly one of the electrode 112 and the electrode 111 may directly contact the gate electrode 113. For example, the electrode 111 may directly contact the gate electrode 113, and the electrode 112 may not directly contact the gate electrode 113.

Analogous to the structure of the access transistor A1, in the structure of the access transistor A2, the electrode 122 may be asymmetrical to the electrode 121 with reference to the gate electrode 123 (or gate member 123).

According to embodiments of the present invention, in the semiconductor device 100, the asymmetrical source-drain structures of the access transistors A1 and A2 may enable desirable electric characteristics (e.g., electric current characteristics) of the semiconductor device 100. As a result, the semiconductor device 100 may have a desirable write noise margin and a desirable read noise margin. Advantageously, satisfactory performance of the semiconductor device 100 may be substantially attained.

Figure 3:
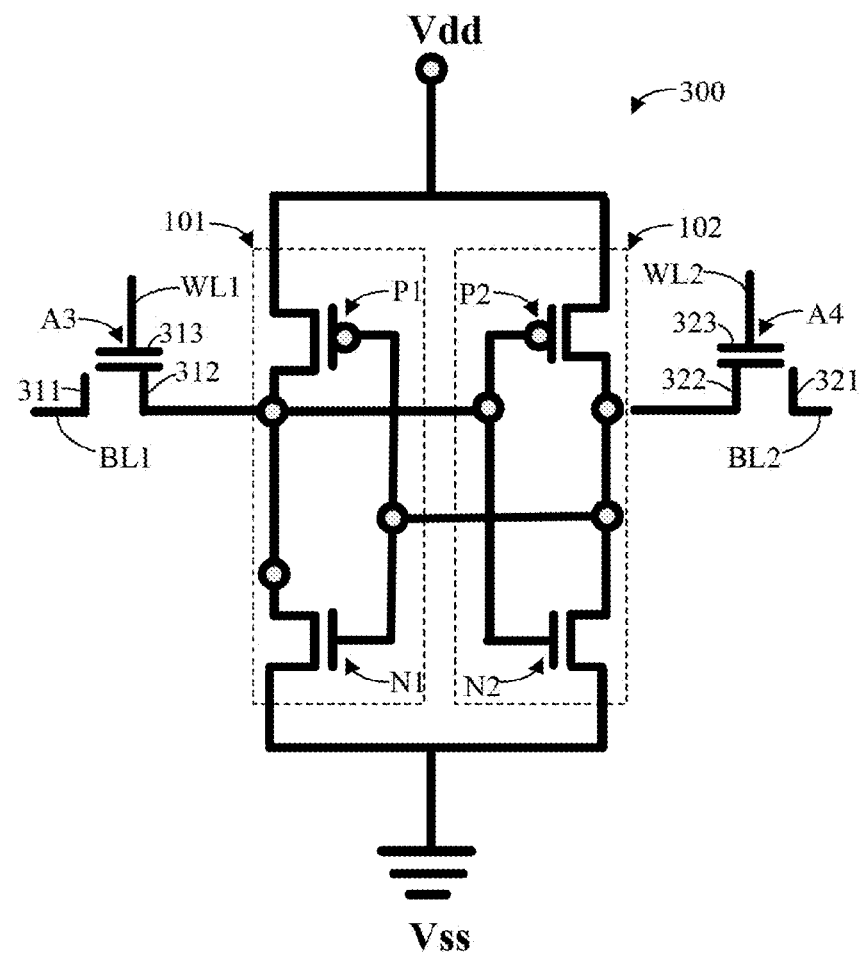
FIG. 3 shows a schematic diagram (e.g., a schematic circuit diagram) that illustrates elements and/or structures in a semiconductor device in accordance with one or more embodiments of the present invention.
Figure 4:
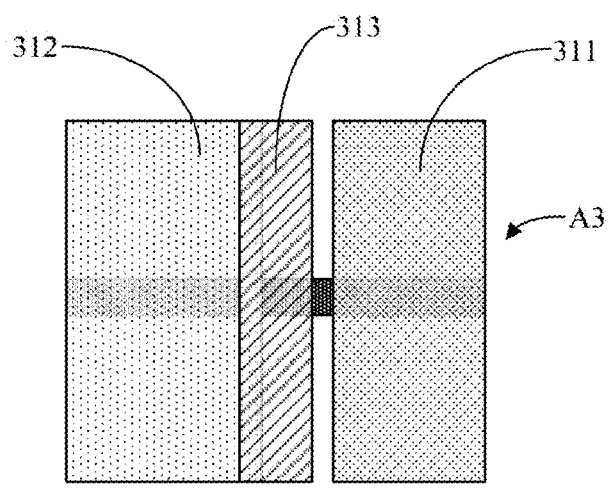
FIG. 4 shows a schematic diagram (e.g., a schematic layout view or a schematic top view) that illustrates elements and/or structures in an access transistor of a semiconductor device in accordance with one or more embodiments of the present invention.

FIG. 3 shows a schematic diagram (e.g., a schematic circuit diagram) that illustrates elements and/or structures in a semiconductor device 300 in accordance with one or more embodiments of the present invention. FIG. 4 shows a schematic diagram (e.g., a schematic layout view or a schematic top view) that illustrates elements and/or structures of an access transistor A3 in a semiconductor device in accordance with one or more embodiments of the present invention. The semiconductor device 300 may have one or more features that are analogous to or identical to one or more of the features of the semiconductor device 100 discussed with reference to FIG. 1 and FIG. 2. The semiconductor device 100 may include an inverter 101, an inverter 102, the access transistor A3, and an access transistor A4.

The access transistor A3 may include an electrode 311, an electrode 312, and a gate electrode 313 (or gate member 313). The electrode 312 and the electrode 311 may respectively be a drain electrode and a source electrode of the access transistor A3. Alternatively, the electrode 332 and the electrode 311 may respectively be a source electrode and a drain electrode of the access transistor A3. The electrode 312 may be electrically connected to both an output terminal of the inverter 101 and an input terminal the inverter 102 (regardless of whether any transistor of the semiconductor device 100 is turned on).

The access transistor A4 may include an electrode 321, an electrode 322, and a gate electrode 323 (or gate member 323). The electrode 322 and the electrode 321 may respectively be a drain electrode and a source electrode of the access transistor A4. Alternatively, the electrode 322 and the electrode 321 may respectively be a source electrode and a drain electrode of the access transistor A4. The electrode 322 may be electrically connected to both an output terminal of the inverter 102 and an input terminal the inverter 101 (regardless of whether any transistor of the semiconductor device 100 is turned on).

The semiconductor device 300 may include a word line WL1, a bit line BL1, a word line WL2, and a bit line BL2. The word line WL1 may be electrically connected to the gate electrode 313 (regardless of whether any transistor of the semiconductor device 100 is turned on). The bit line BL1 may be electrically connected to the electrode 311 (regardless of whether any transistor of the semiconductor device 100 is turned on). The word line WL2 may be electrically connected to the gate electrode 323 (regardless of whether any transistor of the semiconductor device 100 is turned on). The bit line BL2 may be electrically connected to the electrode 321 (regardless of whether any transistor of the semiconductor device 100 is turned on).

Referring to FIG. 4, the electrode 312 may be asymmetrical to the electrode 311 with reference to the gate electrode 313 (or gate member 113). An area of the electrode 312 may be unequal to an area of the electrode 311. For example, an area of the electrode 312 may be larger than an area of the electrode 311 in a layout view of the access transistor A3. A width of the electrode 312 may be unequal to a width of the electrode 311. For example, a width of the electrode 312 in a direction may be greater than a width of the electrode 311 in the direction.

The electrode 312 may be aligned with the electrode 311 in a first direction. At most one of the electrode 312 and the electrode 311 may overlap the gate electrode 313 in a second direction, the second direction being perpendicular to the first direction. In an embodiment, exactly one of the electrode 312 and the electrode 311 may overlap the gate electrode 313 in the second direction. For example, the electrode 312 may overlap the gate electrode 313 in the second direction, and the electrode 311 may not overlap the gate electrode 113 in the second direction.

At most one of the electrode 312 and the electrode 311 may directly contact the gate electrode 313. In an embodiment, exactly one of the electrode 312 and the electrode 311 may directly contact the gate electrode 313. For example, the electrode 312 may directly contact the gate electrode 313, and the electrode 311 may not directly contact the gate electrode 313.

Analogous to the structure of the access transistor A1, in the structure of the access transistor A2, the electrode 122 may be asymmetrical to the electrode 121 with reference to the gate electrode 123 (or gate member 123).

According to embodiments of the present invention, the asymmetrical source-drain structures of the access transistors A1 and A2 may enable the semiconductor device 100 to have desirable electric characteristics (e.g., electric current characteristics), such that the semiconductor device 100 may have a desirable write noise margin and a desirable read noise margin. Advantageously, satisfactory performance of the semiconductor device 100 may be substantially attained.

Figure 8:
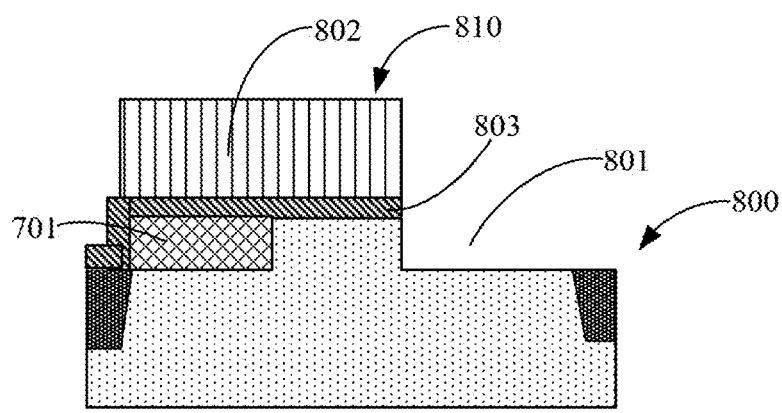
Figure 9:
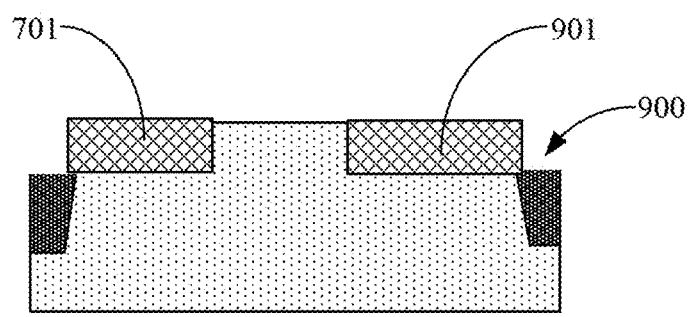
Figure 10:
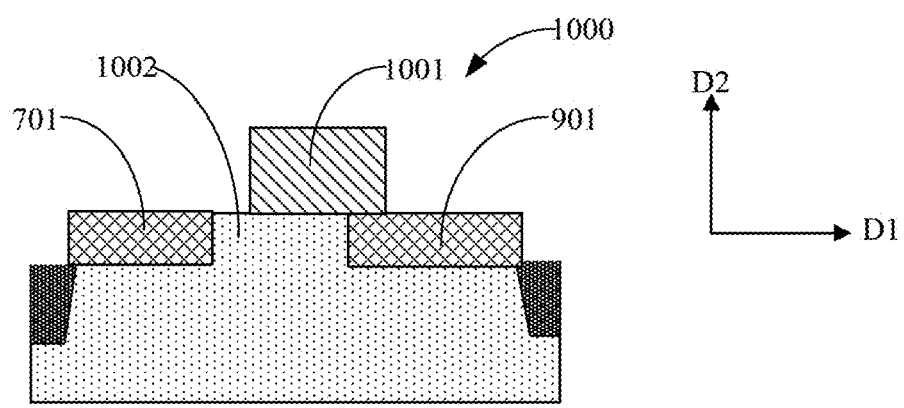

FIG. 5, FIG. 6, FIG. 7, FIG. 8, FIG. 9, and FIG. 10 show schematic diagrams (e.g., schematic cross-sectional views) that illustrate elements and/or structures formed in a method for manufacturing a semiconductor device, which includes one or more access transistors, in accordance with one or more embodiments of the present invention. FIG. 10 shows a schematic diagram (e.g., a schematic cross-sectional view) that illustrates elements and/or structures in an access transistor of the semiconductor device in accordance with one or more embodiments of the present invention. The semiconductor device may represent at least one of the semiconductor device 100 and the semiconductor device 300 discussed above. The access transistor may represent at least one of the access transistor A1, the access transistor A2, the access transistor A3, and the access transistor A4 discussed above.

Figure 5:
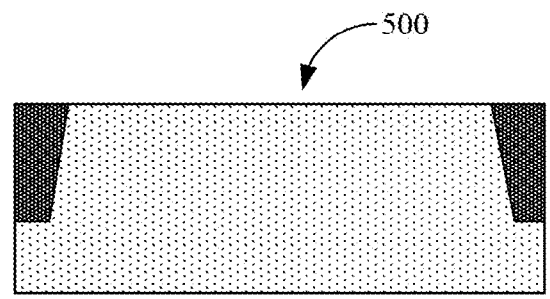
FIG. 5, FIG. 6, FIG. 7, FIG. 8, FIG. 9, and FIG. 10 show schematic diagrams (e.g., schematic cross-sectional views) that illustrate elements and/or structures formed in a method for manufacturing a semiconductor device in accordance with one or more embodiments of the present invention.

Referring to FIG. 5, the method may include providing a semiconductor structure 500. The semiconductor structure may have a fin structure and may include one or more semiconductor materials. The fin structure may be formed through an etching process, e.g., a dry etching process and/or a wet etching process. The semiconductor material may be/include one or more of a monocrystalline silicon material, polycrystalline silicon material, etc. The semiconductor structure 500 may include one or more insulating members.

Figure 6:
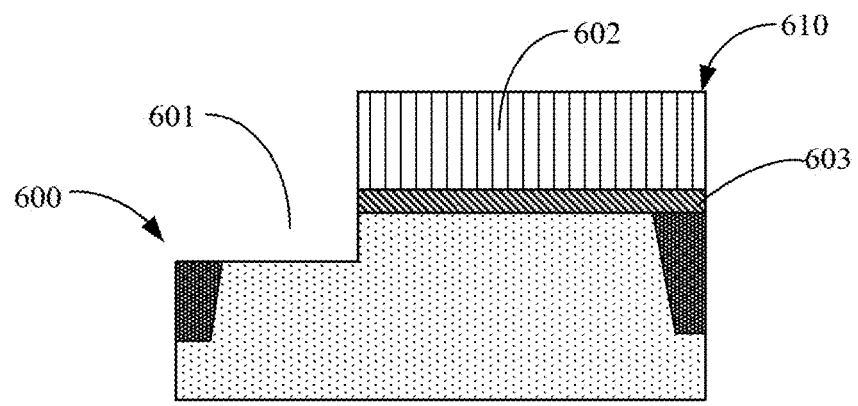

Referring to FIG. 5 and FIG. 6, the method may include partially removing the semiconductor structure 500 to form a semiconductor structure 600. The semiconductor structure 600 may have a trench 601. An etching process, e.g., a dry etching process and/or a wet etching process, may be performed for forming the trench 601. A mask 610 may be used for performing the etching process. The mask 610 may include a silicon nitride layer 603 provided on the semiconductor structure 500 and may include a photoresist material layer 602 provided on the silicon nitride layer 603.

Figure 7:
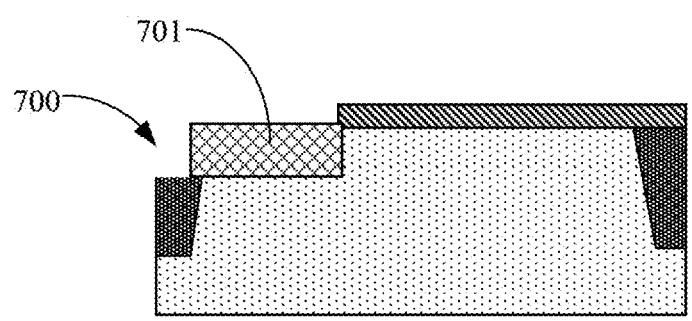

Referring to FIG. 6 and FIG. 7, the method may include performing a first in-situ doping process on the semiconductor structure 600 (and/or in the trench 601) to form a semiconductor structure 700. The semiconductor structure 700 may include an electrode 701, and the electrode 701 may be positioned inside the trench 601. Silicon carbide may be used in the first in-situ doping process, and the electrode 701 may be formed of or may include doped silicon carbide.

Referring to FIG. 7 and FIG. 8, the method may include, after the electrode 701 has been formed inside the trench 601, partially removing the semiconductor structure 700 to form a semiconductor structure 800. The semiconductor structure 800 may have a trench 801. An etching process, e.g., a dry etching process and/or a wet etching process, may be performed for forming the trench 801. A mask 810 may be used for performing the etching process. The mask 810 may include a silicon nitride layer 803 provided on the semiconductor structure 700 and may include a photoresist material layer 802 provided on the silicon nitride layer 803.

Referring to FIG. 8 and FIG. 9, the method may include performing a second in-situ doping process on the semiconductor structure 800 (and/or in the trench 801) to form a semiconductor structure 900. The semiconductor structure 900 may include the electrode 701 and an electrode 901, and the electrode 901 may be positioned inside the trench 801. Silicon carbide may be used in the second in-situ doping process, and the electrode 901 may be formed of or may include doped silicon carbide.

The method may include performing a planarization process on a side of the semiconductor structure 900 that exposes the electrodes 701 and 702. The planarization process may facilitate optimization of structural robustness of a structure that includes a subsequently formed gate member.

The method may include performing a thermal annealing process on the semiconductor structure 900. The thermal annealing process may facilitate ion distribution in each of the electrode 701 and the electrode 901, such that performance of the semiconductor device may be optimized.

Referring to FIG. 9 and FIG. 10, the method may include, after the electrode 901 has been formed inside the trench 801, forming a gate member 1001 on the semiconductor structure 900 to form a semiconductor structure 1000. The gate member 1001 may be/include a gate electrode formed of a conductive material. Spacers may be formed on opposite sides of the gate member 1001. The previously performed planarization process may resulted in a substantially flat surface of the semiconductor structure 900, which may facilitate bonding between the semiconductor structure 900 and at least one of the gate member 1001 and/or bonding between the semiconductor structure 900 and the spacers. Each of the gate member 1001, the electrode 701, and the electrode 901 may directly contact a semiconductor portion 1002 of the semiconductor structure 1000. The semiconductor portion 1002 may be positioned between the electrode 701 and the 901 electrode and may be a channel region of the access transistor. The electrode 701 may be asymmetrical to the electrode 901 with reference to the gate member 1001.

The electrode 701 may be aligned with the electrode 901 in a first direction D1. At most one of the electrode 701 and the electrode 901 may overlap the gate member 1001 in a second direction D2, the second direction D2 being perpendicular to the first direction D1. In an embodiment, exactly one of the electrode 701 and the electrode 901 may overlap the gate member 1001 in the second direction D2. For example, the electrode 901 may overlap the gate member 1001 in the second direction D2, and the electrode 701 may not overlap the gate member 1001 in the second direction D2.

At most one of the electrode 701 and the electrode 901 may directly contact the gate member 1001. In an embodiment, exactly one of the electrode 701 and the electrode 901 may directly contact the gate member 1001. For example, the electrode 901 may directly contact the gate member 1001, and the electrode 701 may not directly contact the gate member 1001.

An area of the electrode 701 may be unequal to an area of the electrode 901. For example, a top surface area of the electrode 701 may be smaller than a top surface area of the electrode 901.

A width of the electrode 701 may be unequal to a width of the electrode 901. For example, a width of the electrode 701 in the first direction D1 may be smaller than a width of the electrode 901 in the first direction D1.

The electrode 701 and the electrode 901 may respectively be a drain electrode and a source electrode of the access transistor. Alternatively, the electrode 701 and the electrode 901 may respectively be a source electrode and a drain electrode of the access transistor. The gate member 1001 may be/include a gate electrode of the access transistor.

The electrode 701 may be the electrode 112 or the electrode 122 discussed with reference to FIG. 1 and FIG. 2 or may be the electrode 311 or the electrode 321 discussed with reference to FIG. 3 and FIG. 4. The electrode 901 may be the electrode 111 or the electrode 121 discussed with reference to FIG. 1 and FIG. 2 or may be the electrode 312 or the electrode 322 discussed with reference to FIG. 3 and FIG. 4. The gate member 1001 may be the gate electrode 113 discussed with reference to FIG. 1 and FIG. 2 or may be the gate electrode 313 discussed with reference to FIG. 3 and FIG. 4.

The method may include forming a first inverter (e.g., the inverter 101 discussed with reference to FIG. 1 and FIG. 3) and forming a second inverter (e.g., the inverter 102 discussed with reference to FIG. 1 and FIG. 3). The electrode 701 or the electrode 901 may be electrically connected to both an output terminal of the first inverter and an input terminal the second inverter (regardless of whether any transistor of the semiconductor device 100 is turned on).

The method may include the following steps: forming a third electrode through the first in-situ doping process or through a third in-situ doping process; after the third electrode has been formed, forming a fourth electrode through the second in-situ doping process or through a fourth in-situ doping process; and after the fourth electrode has been formed, forming a second gate member. The third electrode and the fourth electrode may be analogous to the electrode 701 and the electrode 901. The second gate member may be analogous to the gate member 1001. The third electrode or the fourth electrode may be electrically connected to both an output terminal of the second inverter and an input terminal the first inverter (regardless of whether any transistor of the semiconductor device 100 is turned on). Each of the second gate member, the third electrode, and the fourth electrode may directly contact a second semiconductor portion (of the semiconductor structure 1000), which may be a channel region of a second access transistor of the semiconductor device. The second semiconductor portion may be positioned between the third electrode and the fourth electrode. The third electrode may be asymmetrical to the fourth electrode with reference to the second gate member.

The third electrode and the fourth electrode may respectively be a drain electrode and a source electrode of the second access transistor of the semiconductor device. Alternatively, the third electrode and the fourth electrode may respectively be a source electrode and a drain electrode of the second access transistor of the semiconductor device. The second gate member may be/include a gate electrode of the second access transistor of the semiconductor device.

The method may include forming a bit line (e.g., one of the previously-discussed bit lines BL1 and BL2). The bit line may be electrically connected to the electrode 901 or the electrode 701 regardless of whether the gate member 1001 receives a turn-on signal.

The manufactured semiconductor device, e.g., the semiconductor 100 illustrated in FIG. 1 and/or the semiconductor 300 illustrated in FIG. 3, may have one or more of the features and advantages discussed with reference to FIG. 1, FIG. 2, FIG. 3, and FIG. 4.

Figure 11:
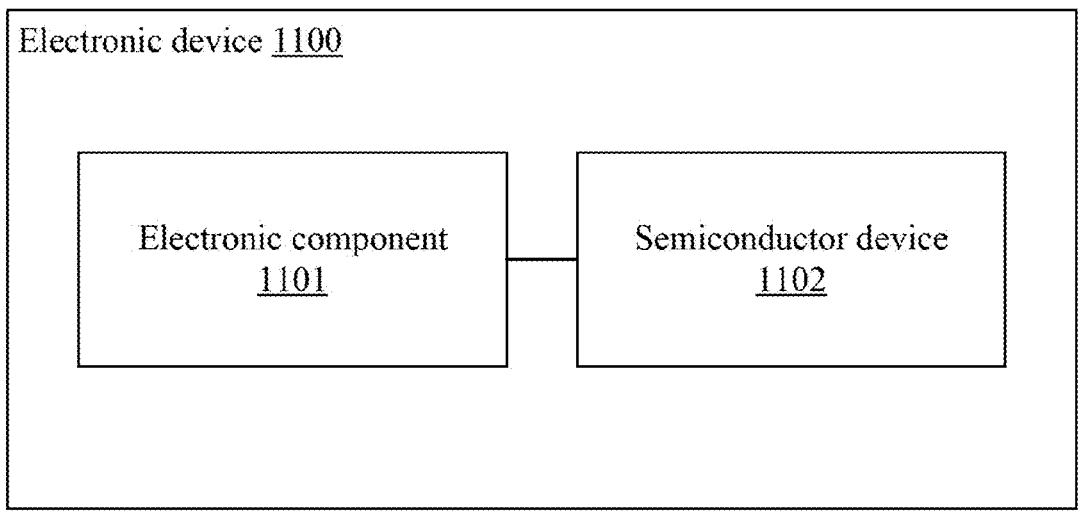
FIG. 11 shows a schematic block diagram that illustrates elements in an electronic device in accordance with one or more embodiments of the present invention.

FIG. 11 shows a schematic block diagram that illustrates elements in an electronic device 1100 in accordance with one or more embodiments of the present invention. The electronic device 1100 may include an electronic component 1101 and a semiconductor device 1102 that is electrically connected to the electronic component 1101. The semiconductor device 1102 may have one or more of the above-discussed features and advantages.

In an embodiment, the electronic device 1100 may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

In an embodiment, the electronic device 1100 may be or may include an intermediate product (e.g., a mobile phone main board) or module.

According to embodiments of the present invention, one or more access transistors of a semiconductor device (e.g., a memory device) may have an asymmetrical source-drain structure. The asymmetrical source-drain structure may enable the semiconductor device to have desirable electric characteristics (e.g., electric current characteristics), such that the semiconductor device may have a desirable write noise margin and a desirable read noise margin. Advantageously, satisfactory performance of the semiconductor device (and satisfactory performance of an electronic device that includes the semiconductor device) may be substantially attained.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A semiconductor device comprising:
    a first inverter;
    a second inverter;
    a first access transistor, wherein a drain electrode of the first access transistor or a source electrode of the first access transistor is electrically connected to both an output terminal of the first inverter and an input terminal the second inverter, wherein the drain electrode of the first access transistor is asymmetrical to the source electrode of the first access transistor with reference to a gate electrode of the first access transistor, wherein exactly one of the drain electrode of the first access transistor and the source electrode of the first access transistor directly contacts the gate electrode of the first access transistor; and
    a second access transistor, wherein a drain electrode of the second access transistor or a source electrode of the second access transistor is electrically connected to both an output terminal of the second inverter and an input terminal the first inverter.

2. The semiconductor device of claim 1, further comprising:
    a first word line, which is electrically connected to the gate electrode of the first access transistor;
    a first bit line, which is electrically connected to the source electrode of the first access transistor;
    a second word line, which is electrically connected to a gate electrode of the second access transistor; and
    a second bit line, which is electrically connected to the source electrode of the second access transistor.

3. The semiconductor device of claim 1, wherein the drain electrode of the first access transistor is aligned with the source electrode of the first access transistor in a first direction, and wherein at most one of the drain electrode of the first access transistor and the source electrode of the first access transistor overlaps the gate electrode of the first access transistor in a second direction, the second direction being perpendicular to the first direction.

4. The semiconductor device of claim 3, wherein exactly one of the drain electrode of the first access transistor and the source electrode of the first access transistor overlaps the gate electrode of the first access transistor in the second direction.

5. The semiconductor device of claim 1, wherein a side of the exactly one of the drain electrode of the first access transistor and the source electrode of the first access transistor directly contacts the gate electrode of the first access transistor an is coplanar with a side of another one of the drain electrode of the first access transistor and the source electrode of the first access transistor.

6. The semiconductor device of claim 1, wherein a side of the exactly one of the drain electrode of the first access transistor and the source electrode of the first access transistor directly contacts the gate electrode of the first access transistor and is coplanar with a side semiconductor member of the first access transistor, and wherein the side of the semiconductor member of the first access transistor directly contacts the gate electrode of the access transistor.

7. The semiconductor device of claim 1, wherein an area of the drain electrode of the first access transistor is unequal to an area of the source electrode of the first access transistor in a layout view of the first access transistor.

8. The semiconductor device of claim 1, wherein a width of the drain electrode of the first access transistor in a direction is unequal to a width of the source electrode of the first access transistor in the direction.

9. The semiconductor device of claim 1, wherein the drain electrode of the second access transistor is asymmetrical to the source electrode of the second access transistor with reference to a gate electrode of the second access transistor.

10. An electronic device comprising: an electronic component; and a semiconductor device electrically connected to the electronic component and comprising: a first inverter; a second inverter; a first access transistor, wherein a drain electrode of the first access transistor or a source electrode of the first access transistor is electrically connected to both an output terminal of the first inverter and an input terminal the second inverter, wherein the drain electrode of the first access transistor is asymmetrical to-a the source electrode of the first access transistor with reference to a gate electrode of the first access transistor and is aligned with the source electrode of the first access transistor in a first direction, wherein a first side of a semiconductor member of the first access transistor is positioned between a first side of the gate electrode of the first access transistor and a second side of the gate electrode of the first access transistor in the first direction, and wherein a side of the drain electrode of the first access transistor or the source electrode of the first access transistor is positioned between the first side of the gate electrode of the first access transistor and the first side of the semiconductor member of the first access transistor in the first direction; and a second access transistor, wherein a drain electrode of the second access transistor or a source electrode of the second access transistor is electrically connected to both an output terminal of the second inverter and an input terminal the first inverter.

* * * * *